United States Patent [19]
Nakayama et al.

[11] Patent Number: 5,718,047
[45] Date of Patent: Feb. 17, 1998

[54] METHOD OF MANUFACTURING ELECTRICAL JUNCTION BOX

[75] Inventors: Makoto Nakayama; Hitoshi Ushijima; Masashi Kitada, all of Shizuoka, Japan

[73] Assignee: Yazaki Corporation, Tokyo, Japan

[21] Appl. No.: 715,578

[22] Filed: Sep. 19, 1996

[30] Foreign Application Priority Data

Sep. 22, 1995 [JP] Japan .................. 7-244364

[51] Int. Cl.⁶ ............................................. H01R 9/14
[52] U.S. Cl. .................. 29/845; 29/739; 439/724
[58] Field of Search .................. 29/845, 825, 739; 439/724

[56] References Cited

U.S. PATENT DOCUMENTS

| | | |
|---|---|---|
| 5,067,905 | 11/1991 | Matsumoto et al. . |
| 5,160,274 | 11/1992 | Ozaki et al. ............ 439/724 X |
| 5,207,591 | 5/1993 | Ozaki et al. ............ 439/724 X |
| 5,249,973 | 10/1993 | Fujita et al. . |
| 5,285,011 | 2/1994 | Shimochi . |
| 5,539,619 | 7/1996 | Murakami . |
| 5,605,465 | 2/1997 | Kobayashi et al. ...... 439/724 X |
| 5,624,280 | 4/1997 | Kato ...................... 439/724 |

FOREIGN PATENT DOCUMENTS

| | | |
|---|---|---|
| 3-102791 | 4/1991 | Japan . |
| 4-74858 | 6/1992 | Japan . |
| 5-70124 | 9/1993 | Japan . |
| 5-299815 | 11/1993 | Japan . |
| 5-316622 | 11/1993 | Japan . |

*Primary Examiner*—Carl J. Arbes
*Attorney, Agent, or Firm*—Armstrong, Westerman, Hattori, McLeland & Naughton

[57] ABSTRACT

A method of manufacturing an electrical junction box, which is provided with a casing constructing an outline thereof and accommodating a circuit board having a desired circuit pattern, a plurality of housings mounted outside the casing for connecting electrical parts such as a fuse, relay and a connector for wiring harnesses, wherein terminals drawn out from the circuit of the circuit board are accommodated in an aligned form in each of the housings, the method comprising the steps of: making a plurality of terminal insertion holes along a predetermined pattern composed of a plurality of paths formed in the casing; forming a circuit pattern by screen printing an electrically conductive paste on the inner surface of the casing from the upper position of the terminal insertion holes; pressure inserting a bottom base portion of the respective terminals into a corresponding one of the plurality of terminal insertion holes; and forming an electrically conductive circuit pattern by depositing a plated layer of a desired thickness onto the screen printed circuit pattern to which the terminals are pressure inserted.

5 Claims, 8 Drawing Sheets

FIG. 8
PRIOR ART
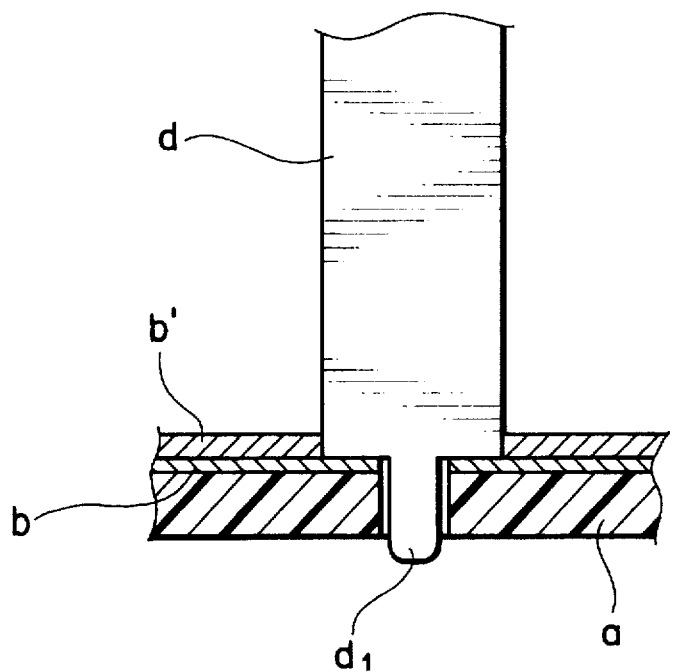
FIG. 9A
PRIOR ART
FIG. 9B
PRIOR ART
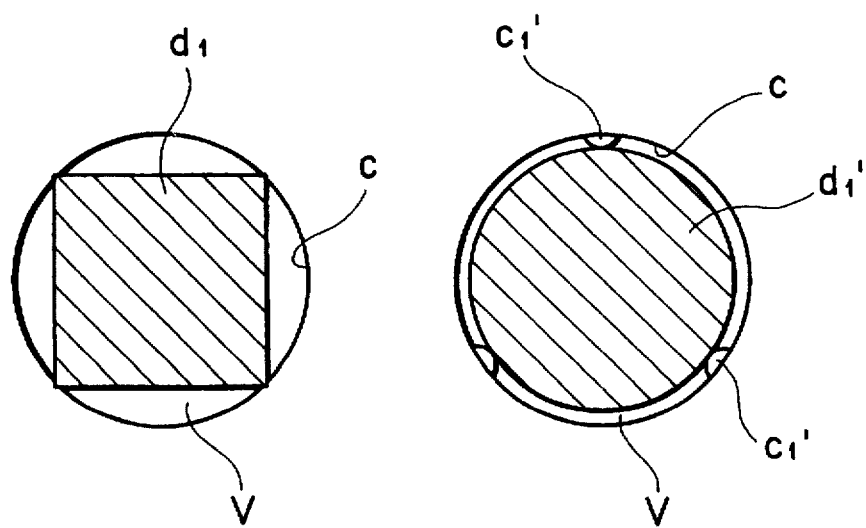

METHOD OF MANUFACTURING ELECTRICAL JUNCTION BOX

BACKGROUND OF THE INVENTION

1. Field of the Invention

The present invention relates to a method of manufacturing an electrical junction box for use in a mutual connection of wiring harnesses or the like, which is capable of reducing the number of parts to be used to minimize the total weight thereof, and also facilitating a wiring of the inner circuit to readily cope with a change in the circuit specification.

2. Description of the Prior Art

So far, there have been provided various methods for forming an inner circuit in an electrical junction box such as a relay box, fuse box, a branch joint box and so on, a case in point being the one shown in Japanese Patent Application Laid-Open No. Heisei 5-299815, wherein the disclosed circuit component is an assembled body composed of a platable first injection molded member formed with a projection rib to form a conductive pattern on the surface thereof, and also a non-platable second injection molded member whose sectional surface is substantially the same as that of the first injection molded member, however with the portion corresponding to the projection rib of the first injection molded member removed. In this structure, the upper surface of the projection rib is formed with an electrically conductive pattern by a plating operation applied to the assembled body.

However, in this method above, the circuit (structured by the projection rib to form an electrically conductive pattern) is made of a resin material to which a catalyzer is applied, so that it becomes costly due to the peculiarity of the material. In addition, since the projection ribs and the assembled body are formed respectively by a specific metal mold, which requires a modification of the mold in accordance with a change in their specifications and so on, the additionally required cost will increase in proportion to the level of the modification.

Further, in Japanese Patent Application Laid-Open No. Heisei 5-316622 it is disclosed the use of a both side manifold-type branch terminal (bus bar) as a circuit component of an electrical junction box, which is structured by connecting symmetrically arranged two manifold-type branch terminals using a joint bridge therebetween, one of which being provided with a plurality of tabs protruded from one side edge of a belt-like common base plate in a comb-like teeth shape, while the other being provided with tabs protruded from the other edge of the common base plate.

However, this both side manifold-type branch terminal also requires an expensive specific mold because of its bus bar die cutting operation, as is required in the case of the above assembled body. Accordingly, each time the shape of the bus bar is changed, another corresponding mold is required, whereby a molding cost is greatly increased in case of a specification change or the like as mentioned in the above case. Further, since a plurality of tabs are connected by a common base plate, in case the applied current is a small one, the common base plate is of a too much capacity for the current, resulting that not only the weight of the product as a whole is increased, but a waste of material is caused as well.

Still further, as shown in Japanese Utility Model Laid-Open No. Heisei 4-74858, a mutual connection assembly is provided in which a desired wiring is formed by mounting a plurality of pressure welding terminals on an insulation base, and thereafter pressing insulation wires in the respective slots of the terminals.

However, it is required to provide a specific facility for the distribution of the insulation wires, and in accordance with a complexity of the wiring pattern, the required facility also becomes complicated, wherein in case it is designed to automatically cope with a change in the specification or the like by use of a program, the total cost of equipment will also become increased.

Still further, as shown in Japanese Utility Model Laid Open No. Heisei 5-70124, a mutual connection device of wiring harnesses is disclosed such that a bus bar pattern section and a printed wiring pattern section are separately formed on one insulation plate, wherein the bus bar of the bus bar pattern section and the printed conductive path of the printed pattern section are connected by soldering a bus bar mounting piece, which is inserted in a mounting troughhole formed in the insulation plate, and the printed conductive path is soldered also to the terminal which is set upright on the insulation plate.

However, in case the circuit of the insulation plate is to be connected with the terminal by soldering, the insulation plate should be made of a material whose resistance to temperature is substantially high (such as epoxy resin, melamine resin), resulting in an increase in the total cost thereof.

As a connecting structure for printed conductive paths and terminals, it is also disclosed in Japanese Patent Application Laid-Open No. Heisei 3-102791 as shown in FIGS. 7A to 7C and FIG. 8 of the present specification, which is structured by forming throughholes c in a plurality of conductive paths h formed on an insulation plate a by moisture etching or the like, and after pressure inserting and fixing a connecting piece d1 of each of a plurality of terminals d, making the conductive path b thicker (b') by an electrolytic or non-electrolytic plating, thereby to increase the current-carrying capacity, and also to integrally connect the connecting piece d1 with the conductive path b due to the metal deposition of the conductive path.

FIG. 9A shows a detailed construction in which the sectional surface of the connecting piece d1 is made square to make a space V between the connecting piece d and the throughhole c for allowing the metal deposition, whereas FIG. 9B shows another detail in which the sectional surface of the connecting piece d1 is made circular, and the inner surface of the throughhole c is formed with a plurality of ribs c1' to maintain a space V.

However, as shown in FIG. 10 and FIG. 11-(1), with the above terminal fixing construction, it is rather difficult to mount the terminal d in such a state that it is upright and an end portion of the connecting piece d1 thereof is protruded for a predetermined length from the throughhole c, and further as shown in FIG. 10-(2), FIG. 11-(3) and (4), the terminal d is likely to be inclined back and forth, or also as shown in FIG. 11-(2), the connecting piece d1 is not likely to be fully inserted.

The present invention has been made for solving the above problems, and it is an object of the present invention to provide a method of manufacturing an electrical junction box, which does not require a specific mold for forming a circuit, and is capable of easy wiring in the inner circuit and coping with a modification of the specification, being thereby suitable for reducing the number of parts to be used, as well as minimizing the total weight thereof.

SUMMARY OF THE INVENTION

In order to accomplish the above object, the method of manufacturing an electrical junction box is for producing an electrical junction box in which a circuit plate having a desired circuit pattern is accommodated within a casing that forms an outline of the junction box, a plurality of housings for connecting electrical parts such as a fuse, relay and a connector for wiring harnesses are mounted outside the casing, and wherein the terminals drawn out from the circuit of the circuit board are accommodated in an aligned form in each of the housings, which method comprising the steps of: making a plurality of terminal insertion holes along a predetermined pattern composed of a plurality of paths formed in the casing; forming a circuit pattern by screen printing an electrically conductive paste on the inner surface of the casing from the upper position of the terminal insertion holes; pressure inserting a bottom base portion of the respective terminals into a corresponding one of said plurality of terminal insertion holes; and forming an electrically conductive circuit pattern by depositing a plated layer of a desired thickness onto the screen printed circuit pattern to which said terminals are pressure inserted.

In the above method, as shown in claim 2, it is recommended that each of the terminal insertion holes of the casing is formed in a slit like shape, having a locking projection at one of opposing sides of the inner surface of the terminal insertion hole, while each of the terminals is formed with a connecting piece at the base portion thereof by way of a widened stopper, which connecting piece further being formed with a locking hole, wherein the stopper is brought into contact with the circuit pattern by a pressure insertion of the terminal into the insertion hole, and the terminal is fixed by an engagement of the locking hole with the locking projection.

Further, in the above method, it is also recommended as shown in claim 3 to form such that the both side edges of the connecting piece of said terminal are formed respectively with a locking claw, and the locking claw is sunk into the inner surface of the terminal insertion hole when the terminal is pressure inserted to be fixed.

Still further, in the above method, it is further recommended to form, as shown in claim 4, such that the terminal insertion hole is formed with a narrowed positioning hole in a consecutive manner at the lowest portion thereof, the connecting piece of the terminal being further formed with a narrowed positioning piece at the lowest portion thereof, wherein said terminal is held upright by guiding said positioning piece into said positioning hole when said terminal is pressure inserted and secured.

As explained heretofore, according to claim 1 of the present invention, a circuit design and wiring thereof are both easy, and can readily and cheaply cope with a change in the circuit specification, only by changing the printing plate.

Further, as the width and thickness of the circuit can be optimized, the whole size and weight can be minimized, resulting thus in the saving of natural resources. Still further, as it is not necessarily required to use only a straight plate such as an insulation plate and a wiring plate for forming a circuit through printing or plating, but a curved surface can also be used, these insulation and wiring plates can be omitted to thus minimize the number of parts to be used. Furthermore, as a soldering operation can be obviated for the connection between the terminals and the conductive pattern, the total manufacturing cost can be reduced, and still further, since widely used resin materials such as vinyl chrolide polyethylene whose heat resisting characteristic is quite low can be used instead of a material whose resistance to temperature is substantially high, the material cost can also be greatly reduced.

In addition to these merits as mentioned above, as the terminal insertion hole is of a slit shape according to claim 2, and the depth of insertion is limited by a stopper, the height of the terminal from the plate surface can be made constant. Further, as the connecting piece is formed with a locking claw according to claw 3 of the present invention, and the thus formed locking claw sinks into the inner surface of the terminal insertion hole, it functions as a return-prevention claw, thereby to reinforce the locking force as a whole.

Still further, since the terminal can be held upright because of an engagement between the terminal positioning piece and the terminal insertion hole as claimed in claim 4 of the present invention, it is perfectly prevented for the terminal from inclining downward when or after the pressure insertion of the terminal, so that the correct positioning and fixing of the terminal with respect to the conductive circuit pattern can be performed the whole time.

Other features and advantages of the invention will be apparent from the following description taken in connection with the accompanying drawing.

BRIEF DESCRIPTION OF THE DRAWINGS

FIG. 8 is a sectional view of an important portion showing a connected structure between the terminal and the conductive path of FIGS. 7A to 7C;

FIGS. 9A and 9B are sectional views respectively showing a connecting piece of the terminal of FIG. 8;

DETAILED DESCRIPTION OF THE PREFERRED EMBODIMENTS

Figure 1:
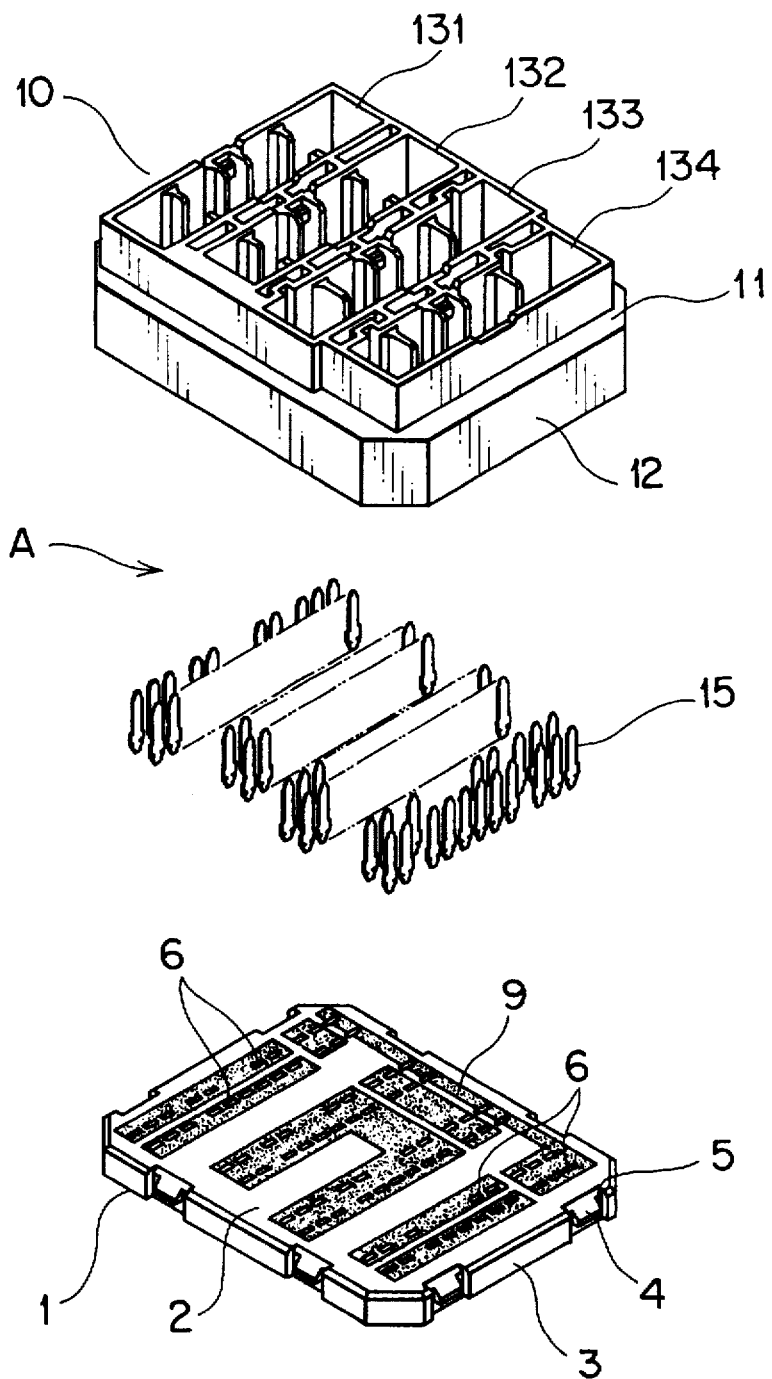
FIG. 1 is an explanatory view of a process for manufacturing the electrical junction box according to the present invention.

The method of manufacturing an electrical junction box according to the present invention will now be described by referring to the accompanying drawings.

The electrical junction box A as shown in FIGS. 1 to 4 is made as a branch junction box for connecting the connectors formed at end portions of respective wiring harnesses, and there are formed in advance a lower casing 1 made of insulation plastic, an upper casing 10 made of the same material and a plurality of terminals 15, wherein the lower and upper casings are both plastic molded.

The lower casing 1 is composed of a bottom plate 2 functioning as a circuit board as well, and a peripheral wall 3 supporting this bottom plate 2. The peripheral wall 3 is formed with a plurality of locking projections 4 each by way of a recess 5. The bottom plate 2 as a circuit board is formed with a plurality of terminal insertion holes 6 so as to be positioned at the center of the respective conductive paths in a prearranged circuit pattern. These insertion holes 6 can be molded simultaneously or after the molding operation.

The upper casing 10 is formed as a lid for covering the lower casing 1, composed of a ceiling plate 11 that functions as a housing bottom plate and the peripheral surfaces 12 thereof in which there are formed self-locking members (not shown) to be locked respectively by the above-mentioned locking projections 4, constructing altogether a locking means for locking the lower and upper casings. Further, a plurality of housings 131, 132, . . . 134 are formed on the ceiling plate 11 of the upper casing 10 in a parallel relation, and each housing is engagably connected with connectors of respective wiring harnesses.

Each of the terminals 15 is formed with a connecting piece 19 having a locking hole 18 by way of a widened stopper 17 at the base side thereof in a consecutive manner, wherein the connecting piece 19 is formed with a locking claw 20 at the opposite lateral sides thereof, and also formed with a narrowed positioning piece 21 at the lowest end thereof.

The terminal insertion hole 6 is formed in such a manner that the sectional surface thereof is in an elongated slit like shape for receiving the connecting piece 19 of the terminal 15, and a locking projection 7 is formed at one surface side of the inner surface thereof, whereas a narrowed positioning hole 8 is consecutively formed to the lowest end of the terminal insertion hole 6.

Next, a method of forming an inner circuit is explained below.

First, as shown in FIG. 1, a conductive paste is printed onto the circuit board 2 of the lower casing 1 by use of a printing plate to form a circuit pattern 9 made of a plurality of paths. This circuit pattern 9 is set in such a manner that the terminal insertion holes 6 are positioned at the center of each of the paths of a prearranged circuit pattern.

The printing plate is of a known mesh structure generally used for screen printings. The conductive paste used here is of a high conductivity of less than $10^{-1}$ Ωcm, and capable of penetrating the above mesh structure. After it is printed to a thickness of several tens of μm, a positive circuit pattern depicted in the printing plate is printed.

After the printing operation, the lower casing 1 is shifted to a dry furnace, and thereafter the paste is hardened to complete the circuit pattern 9.

The conductive paste used for forming the circuit pattern is a liquid compound of a matrix resin and a conductive filler, which can be diluted by a solvent on request. The matrix resin can be the one made by dissolving a thermoplastic resin in a solvent, a liquid thermosetting resin, a thermosetting resin dissolved in a solvent, and a liquid ultraviolet curing resin and so on.

The conductive filler can be a metal filler or a carbon filler. The metal filler includes particles, fiber, whisker, or a flake of such metals as gold, silver, nickel, copper, or alloy or oxide thereof. Further, the carbon filler includes a particulate carbon black, fibrous carbon fiber, graphite fiber, carbonized whisker, and flake natural graphite powder. Still further, a carbon filler whose surface is coated with metal, or metal-coated insulation fiber or particles can also be used.

The conductive paste is produced by adding 10-90 weight percent of these conductive fillers to the matrix resin.

Figure 2:
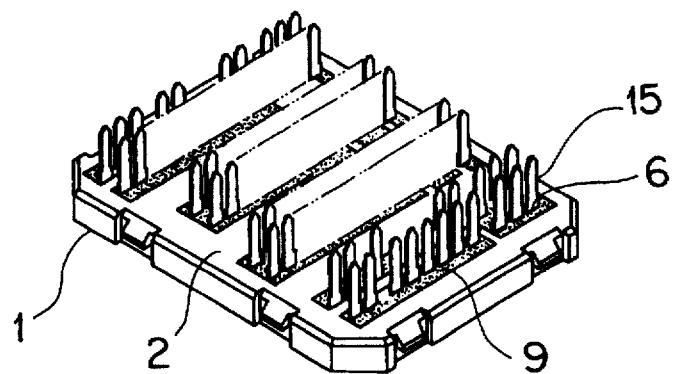
FIG. 2 is an explanatory view showing a process after the process of FIG. 1.

Next, as shown in FIG. 2, the connecting piece 19 of the terminal 15 is pressure inserted to the terminal insertion hole 6 of the cured circuit pattern 9. In other words, when the connecting piece 19 of the terminal 15 is pressure inserted into the terminal insertion hole 6, the positioning piece 21 is further brought to the positioning hole 8 in the terminal insertion hole 6. The terminal 15 is mounted upright by their positioning piece 21, a guiding function of the positioning hole 8, and a cooperation of the slit like terminal insertion hole 6. Then, since the widened stopper 17 abuts against the surface (circuit pattern 9) of the circuit board 2, and the locking projection 7 is fitted with the locking hole 18, the height of the terminal 15 from the base plate is made constant, and it can thus be secured.

Figure 3:
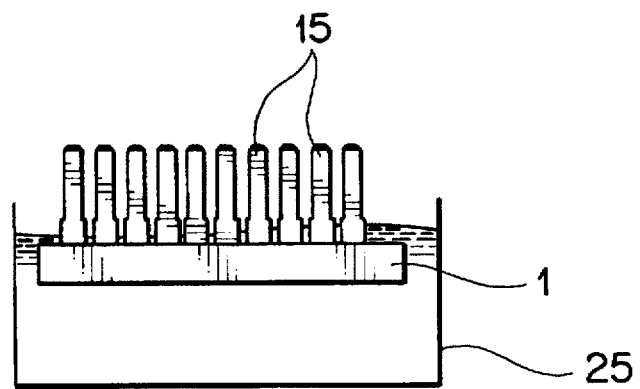
FIG. 3 is an explanatory view showing a process after the process of FIG. 2.
Figure 4:
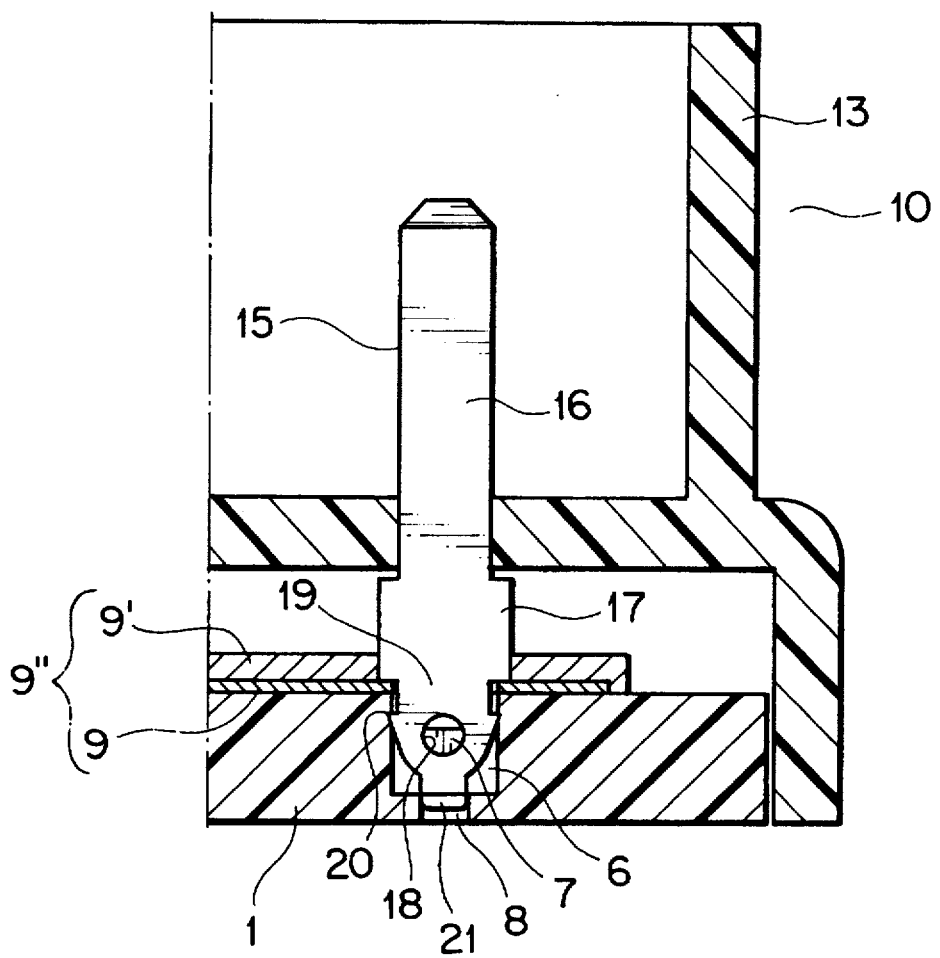
FIG. 4 is a partly sectioned view of the complete product.
Figure 5:
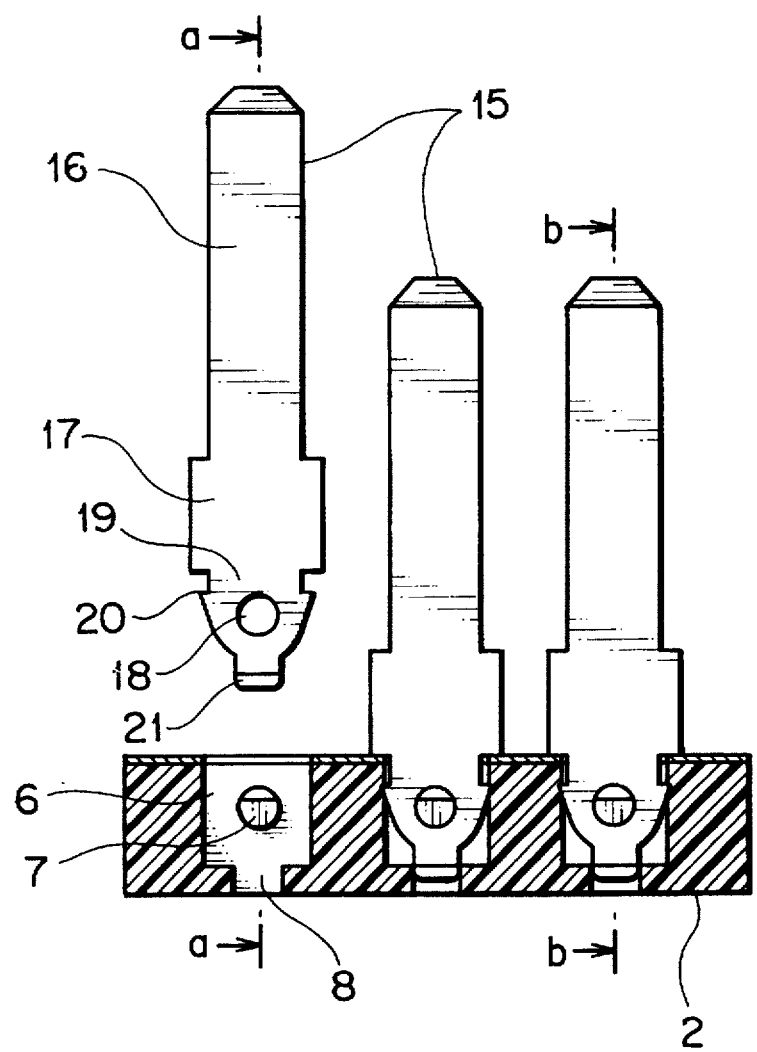
FIG. 5 is a magnified sectional view of an important portion showing a pressure-inserting structure of the terminal of FIG. 2.
Figure 6A:
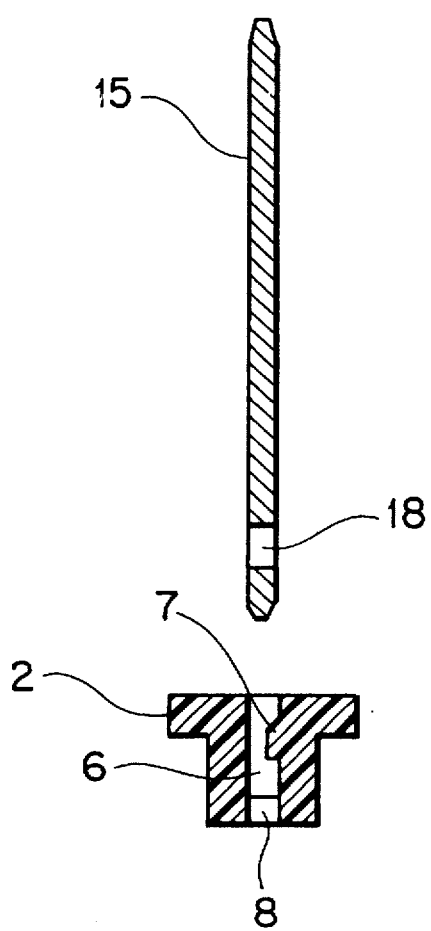
FIGS. 6A and 6B are sectional views observing respectively along the line a—a, and line b—b of FIG. 5.
Figure 6B:
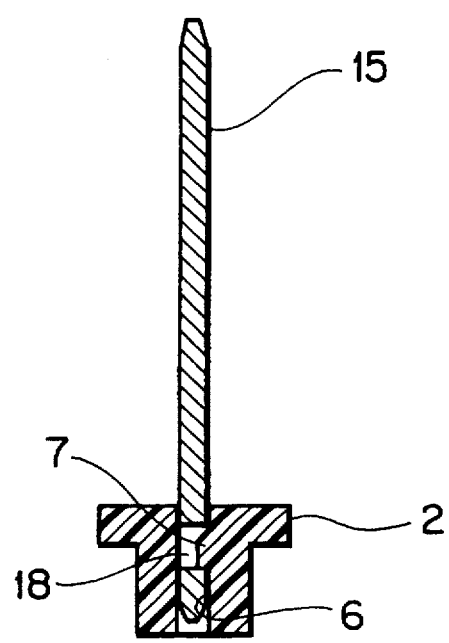
Figure 7A:
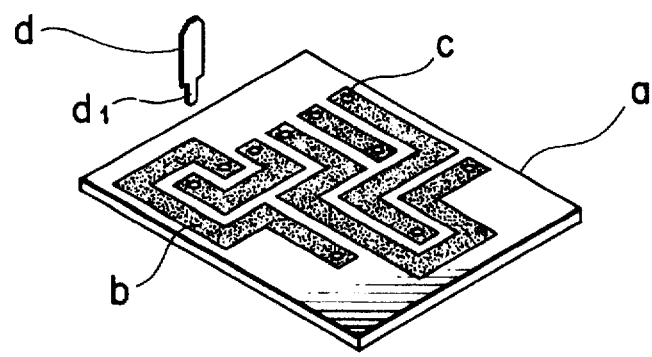
FIGS. 7A, 7B and 7C are perspective views showing the terminal fixing process to the conventional printed circuit board.
Figure 7B:
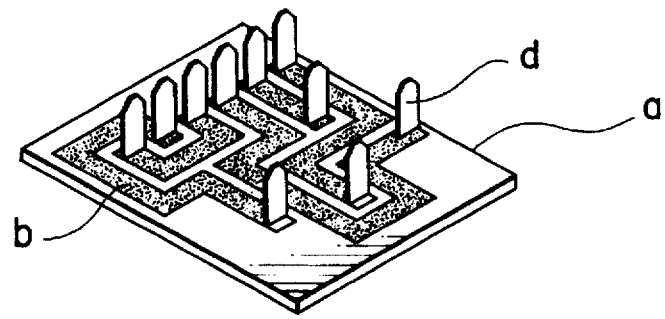
Figure 7C:
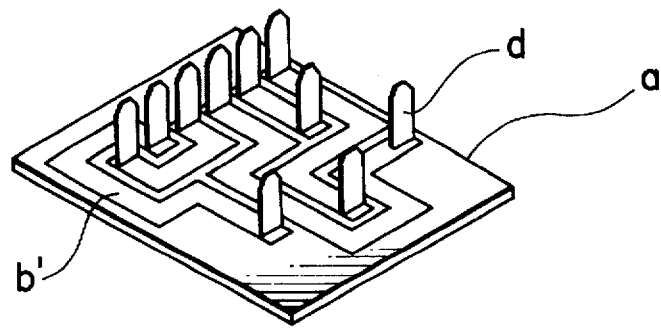
Figure 10:
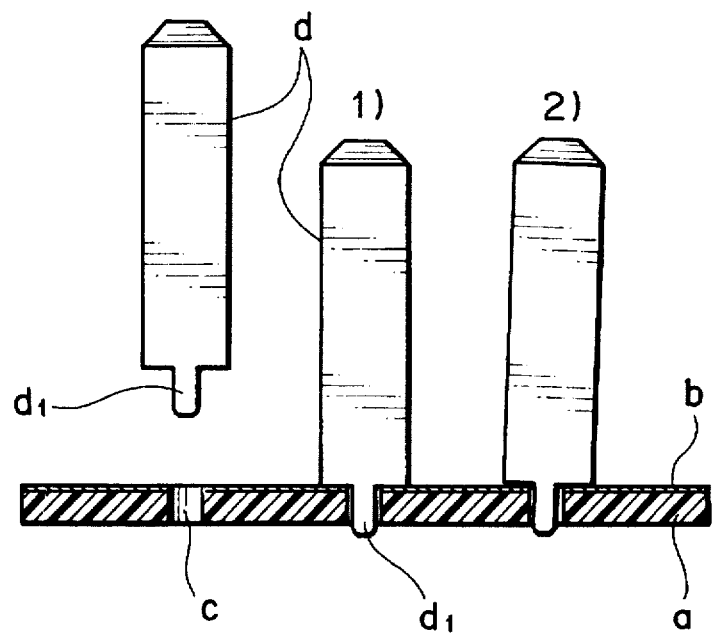
FIG. 10 is a partly broken front view showing a state in which the terminal of FIGS. 9A, 9B is fixed by a pressure insertion to the insulation plate.
Figure 11:
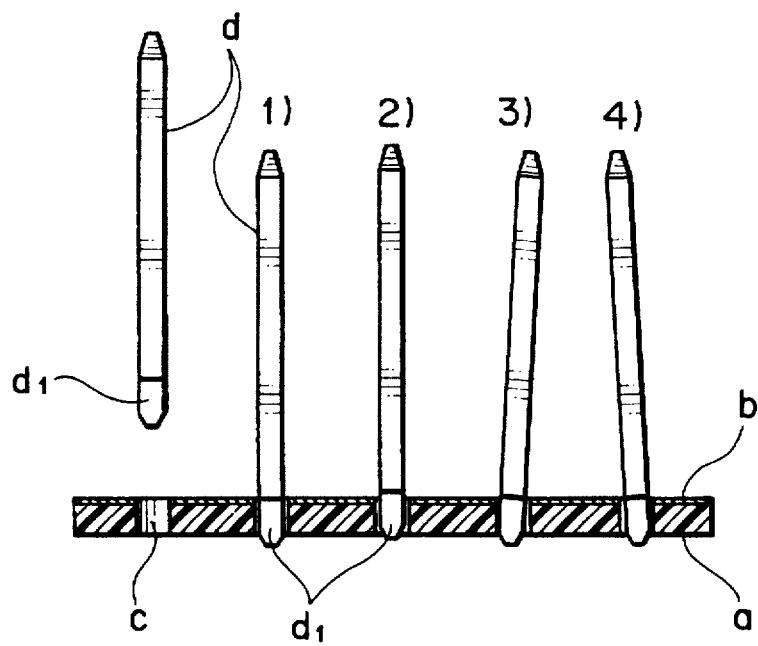
FIG. 11 is side view of FIG. 10.

Next, as shown in FIG. 3, the lower casing 1 to which the terminal 15 is fixed is shifted into a plating vessel 25 in order to apply an electrolytic plating thereto. As to the condition for electrolyte plating, the conventionally admitted condition will do. By this operation, a conductive metal 9' such as copper, tin, and nickel is deposited to a desired thickness to the circuit pattern 9 by the conductive paste, so as to form a conductive circuit pattern 9" composed of a circuit pattern (conductive paste) 9 and the conductive metal (plated layer) 9'. Being a copper alloy, the terminal 15 is simultaneously plated, and the terminal 15 and the conductive circuit pattern 9" are thereby connected.

When, after the plating operation, pulling up the lower casing 1 from the plating vessel 25, washing, drying and putting the upper casing 10 on it, the both casings are mutually secured by the locking means (the locking projection 4 and the self-locking member). Simultaneously, each tab 16 of the terminals 15 connected with the conductive circuit pattern 9" is protruded into a corresponding one of predetermined housings 131, 132, 133, and 134 from insertion holes (not shown) formed and aligned in the ceiling 11 of the upper casing 10. Accordingly, terminal connectors (not shown) of wiring harnesses can be connected with corresponding one of these housings.

According to the present invention, since the terminals 15 are simultaneously and integrally connected with the conductive circuit pattern 9" by one plating operation, no further process will be necessary thereafter. Besides, due to the fact that no soldering operation is required, there is no need to use an expensive heat-resistive resin material for the lower casing 1 (or circuit board 2), as has been used conventionally, but cheap thermoplastic resin materials such as vinyl chloride, polyethylene and so on can be used instead, resulting that the total cost can be greatly reduced.

In the above explanation, a branch junction box is taken up as an example, wherein the upper casing 10 of the electrical junction box is provided with a plurality of connecting housings 131, 132, 133, and 134. However, it is not limited only to these housings for connecting the connectors, but other type of housings, for example for connection of electrical parts that protect and/or control circuits for fuse, relay and so on, can also be mounted. In these cases, the conductive circuit pattern 9" can be printed with a desired pattern.

EFFECT OF THE INVENTION

As explained heretofore, according to claim 1 of the present invention, the circuit design and wiring thereof are both easy, and can readily and cheaply cope with a change in the circuit specification, only by changing the printing plate. Further, by optimizing the width and thickness of the circuit, the whole size and weight can be minimized, resulting thus in the saving of natural resources. Still further, as it is not necessarily required to use only a straight plate such as an insulation plate and a wiring plate for forming a circuit through printing or plating, but a curved surface can also be used, these insulation and wiring plates can be omitted to thus minimizing the number of paths to be used. Furthermore, as a soldering operation can be obviated for the connection between the terminals and the conductive pattern, the total manufacturing cost can be reduced, and still further, since widely used resin materials such as vinyl chrolide polyethylene whose heat resisting characteristic is quite low can be used instead of a material whose resistance to temperature is substantially high, the material cost can also be greatly reduced.

In addition to these merits as mentioned above, as the terminal insertion hole is of a slit shape (claim 2), and the depth of insertion is limited by a stopper, the height of the terminal from the plate surface can be made constant.

Further, as the connecting piece is formed with a locking claw (claim 3), and the thus formed locking claw sinks into the inner surface of the terminal insertion hole, it functions as a return-prevention claw, thereby to reinforce the locking force as a whole.

Still further, since the terminal can be held upright because of an engagement between the terminal positioning piece and the terminal insertion hole (claim 4), it is perfectly prevented for the terminal from inclining downward when or after the pressure insertion of the terminal, so that the correct positioning and fixing of the terminal with respect to the conductive circuit pattern can always be performed.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. A method of manufacturing an electrical junction box, which is provided with a casing constructing an outline thereof and accommodating therein a circuit board having a desired circuit pattern, a plurality of housings mounted outside said casing for connecting electrical parts such as a fuse, relay and a connector for wiring harnesses, wherein terminals drawn out from the circuit of said circuit board are accommodated in an aligned form in each of said housings, said method comprising the steps of:

making a plurality of terminal insertion holes along a predetermined pattern composed of a plurality of paths formed in said casing;

forming a circuit pattern by screen printing an electrically conductive paste on the inner surface of said casing from the upper position of said terminal insertion holes;

pressure inserting a bottom base portion of the respective terminals into a corresponding one of said plurality of terminal insertion holes; and forming an electrically conductive circuit pattern by depositing a plated layer of a desired thickness onto said screen printed circuit pattern to which said terminals are pressure inserted.

2. A method of manufacturing an electrical junction box as claimed in claim 1, wherein each of said terminal insertion holes in said casing is formed in a slit like shape, having a locking projection at one of opposing sides of the inner surface of said terminal insertion hole, while each of said terminals is formed with a connecting piece at the base portion thereof by way of a widened stopper, said connecting piece further being formed with a locking hole, wherein said stopper is brought into contact with the circuit pattern by pressure insertion of said terminal into said insertion hole, and said terminal is fixed by an engagement of said locking hole with said locking projection.

3. A method of manufacturing an electrical junction box as claimed in claim 2, wherein the both side edges of said connecting piece of said terminal are formed respectively with a locking claw, and said locking claw is sunk into the inner surface of said terminal insertion hole when said terminal is pressure inserted and fixed.

4. A method of manufacturing an electrical junction box as claimed in claim 2 or 3, wherein said terminal insertion hole is further formed with a narrowed positioning hole in a consecutive manner at the lowest portion thereof, and said connecting piece of the terminal is further formed with a narrowed positioning piece at the lowest portion thereof, wherein said terminal is held upright by guiding said positioning piece into said positioning hole when said terminal is pressure inserted and fixed.

5. A method of manufacturing an electrical junction box as claimed in claim 2, wherein said electrically conductive paste is of a high conductivity of less than $10^{-1}$ Ωcm, and capable of penetrating a mesh structure of a printing plate used for the screen printing operation.

* * * * *